(12) United States Patent
Hagen et al.

(10) Patent No.: US 7,236,900 B2
(45) Date of Patent: Jun. 26, 2007

(54) THREE DIMENSIONAL CORRELATED DATA DISPLAY

(75) Inventors: Michael S. Hagen, Vancouver, WA (US); Wendell W. Damm, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 237 days.

(21) Appl. No.: 10/828,936

(22) Filed: Apr. 20, 2004

(65) Prior Publication Data
US 2005/0234670 A1 Oct. 20, 2005

(51) Int. Cl.
*G01R 13/02* (2006.01)
(52) U.S. Cl. ............ 702/67; 345/440; 324/76.22; 324/76.24
(58) Field of Classification Search ............ 702/66–68, 702/71, 72, 75–78; 345/440, 440.1, 440.2
See application file for complete search history.

(56) References Cited

U.S. PATENT DOCUMENTS

| 2003/0036864 A1* | 2/2003 | Randall et al. ............ 702/79 |
| 2003/0058243 A1* | 3/2003 | Faust et al. ............ 345/440 |
| 2004/0174818 A1* | 9/2004 | Zocchi ............ 370/241 |

\* cited by examiner

*Primary Examiner*—Manuel L. Barbee
(74) *Attorney, Agent, or Firm*—Thomas F. Lenihan; Francis I. Gray (57) ABSTRACT

A method and apparatus for synchronizing presentation of multi-domain measurements using actual or quasi 3-D representation. The synchronization between data streams acquired in different measurement domains is performed by using timestamps, a common trigger event, or a common clock, or a combination of any or all of them. In this way, for example, a transient anomaly in the RF spectrum of a communications signal may be correlated with, and displayed with, a related corrupted data communications packet.

21 Claims, 7 Drawing Sheets

Fig. 7

THREE DIMENSIONAL CORRELATED DATA DISPLAY

FIELD OF THE INVENTION

The present invention relates to the field of graphic visualization tools and, more particularly, to three-dimensional representations of multi-domain measurements of system operation.

BACKGROUND OF THE INVENTION

Signals acquired from relatively simple systems can be viewed and understood using two-dimensional graphing techniques that represent electrical activity at one or more nodes in a circuit under test. Testing of more complex systems requires that many nodes (often hundreds) be viewed, and the information content and different timing relationships of these signals must be presented to the user.

A problem arises because different measurement instruments are used to gather information in different measurement domains, and each measurement domain provides a different view of circuit activity over time. For example, an oscilloscope provides representations of electrical phenomena associated with a circuit node, a logic analyzer provides representations of information content (i.e., logic level and transition timing) on a (typically) related set of nodes, and a spectrum analyzer represents the intensity or energy associated with each of a plurality of frequency components. Unfortunately, it can be difficult for a user to correlate information derived from each of the measurement domains to arrive at a higher level of understanding of the operation or failure of a system under test.

What is needed is a method and apparatus for combining the measurement results from the different measurement domains into a correlated, and easy to understand display.

SUMMARY OF INVENTION

These and other deficiencies of the prior art are addressed by the present invention of a method and apparatus for a synchronized presentation of multi-domain measurements using an actual or quasi 3-D representation.

A method according to one embodiment of the invention comprises receiving a plurality of sample streams representing respective signal measurements; temporally aligning the sample streams; and generating waveform data associated with the temporally aligned sample streams, the waveform data representing sample magnitudes as a function of time and including Z-axis information adapted to illustrate at least one inter-stream timing relationship.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the FIGURES.

DETAILED DESCRIPTION OF THE INVENTION

The subject invention will be primarily described within the context of a signal acquisition system having a plurality of function modules where each function module performs a respective different signal processing and/or analysis function. However, it will be appreciated by those skilled in the art that the various function modules may be used to implement any combination of functions, including multiple instances of the same function. It will further be appreciated by those skilled in the art that the invention may be advantageously employed in any environment where multiple signal acquisition and/or analysis devices process signals under test, wherein a common correlated display of information derived from such processing is useful. Thus, even though FIG. 1 shows a system incorporating a plurality of function modules, the various function modules may be dispersed or otherwise provided by additional test and measurement instruments for acquisition of data samples by the various test and measurement instruments.

To achieve a multi-domain measurement display, embodiments of the present invention utilize a common time reference between the various measurement domain instruments such that an inter-stream timing relationship is established to enable a 3-D or quasi 3-D waveform representation of the measurements performed by the various instruments. These measurements must then be presented to the engineer in a manner that more readily allows the presented measurement information to be integrated into a meaningful analysis. In this manner, a user may gain insight into the cause and effect relationships in the operation or failure of the system under test.

Figure 1:
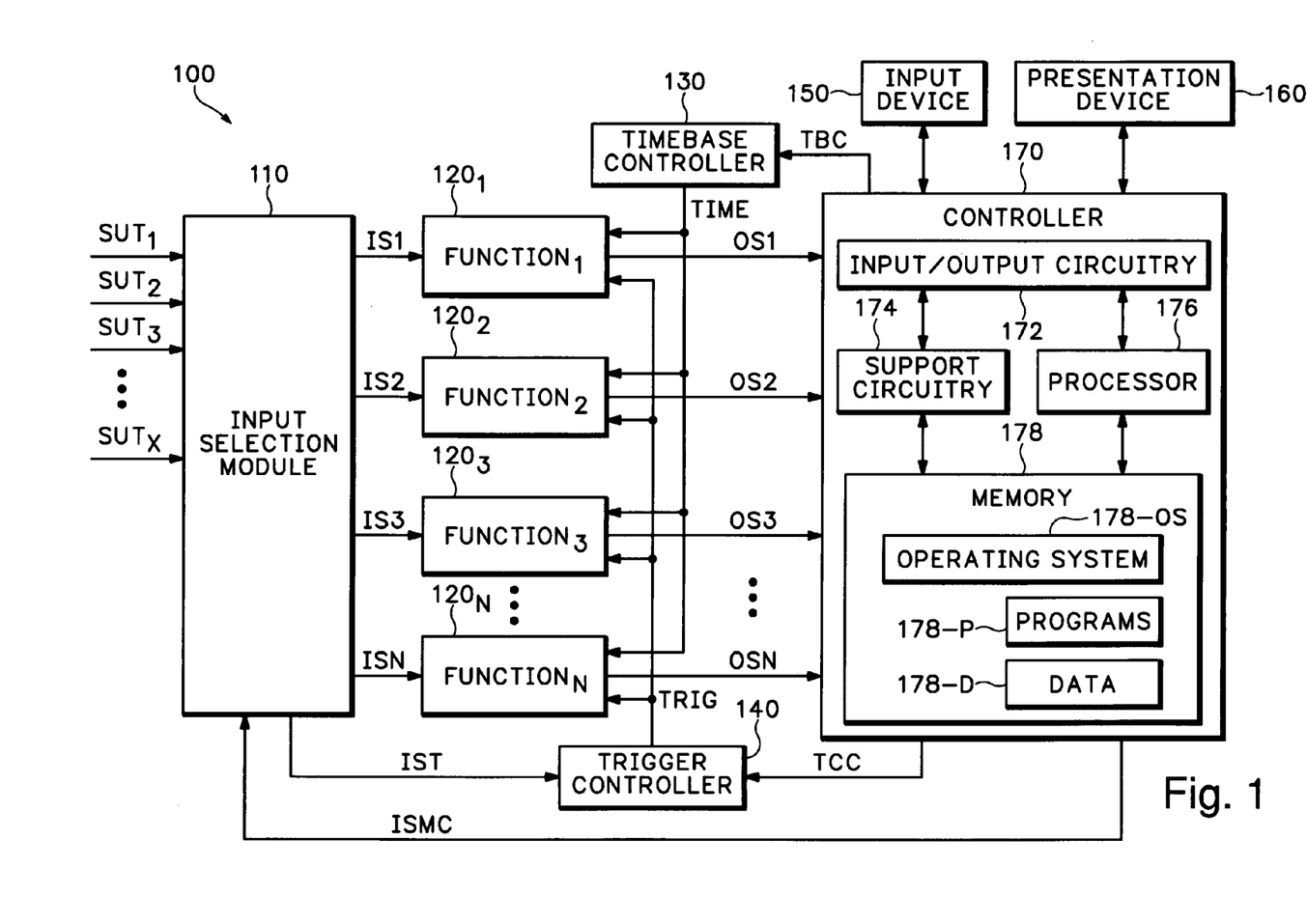
FIG. 1 is a high level block diagram of a signal analysis and display system according to an embodiment of the invention.

FIG. 1 is a high level block diagram of a system according to an embodiment of the present invention. Specifically, the system 100 of FIG. 1 comprises an optional input selection machine 110, a plurality of signal analysis functions $120_1$–$120_N$ (collectively signal analysis functions 120), a time base 130, a trigger controller 140, an input device 150, a presentation device 160, and a controller 170.

Each of the signal analysis functions 120 comprises any one of a digital storage oscilloscope (DSO) function, a logic analyzer function, a network analysis function, a spectrum analysis function, and the like. Each of the signal analysis functions 120 receives a corresponding input signal $IS_1$–$IS_N$ for processing, which processing results in a corresponding output stream $OS_1$–$OS_N$. Thus, the first input signal $IS_1$ is processed by first signal analysis function $120_1$ to produce first output stream $OS_1$ and so on up to an Nth signal analysis function $120_N$ processing an Nth input signal $IS_N$ to produce an Nth output stream $OS_N$. It should be noted that a single input signal IS may be used to drive one or more of Signal Analysis Functions 120. It will be noted that each of the input signals $IS_1$–$IS_N$ may comprise one or many respective input signals though it is represented by a single arrow in FIG. 1. For example, in the case of a signal analysis function 120 comprising a logic analyzer, the corresponding input signal may comprise dozens or hundreds of actual input signals.

Each of Signal Analysis Functions 120 is responsive to a trigger signal TRIG produced by Trigger Controller 140 and a time base signal TIME produced by Time Base Controller 130. Thus, the data acquisition and analysis functions provided by the various Signal Analysis Functions 120 may be synchronized and commonly triggered as desired. In this manner, the resulting output data streams $OS_1$–$OS_N$ provide temporally-related data which may be aligned in time to support a temporally-synchronized display of data from each of a plurality of measurement domain instruments.

Optional Input Selection Module 110 is capable of receiving a plurality of signals under test $SUT_1$–$SUT_X$ (collectively signals under test SUT). Optional Input Selection Module 110, in response to a control signal ISMC provided by Controller 170, couples any of the input signals under test SUT, through $SUT_X$ to any of Signal Analysis Functions $120_1$–$120_N$ as corresponding input signals IS. Optional Input Selection Module 110 is useful where many signals under test are to be switched or where multiple Signal Analysis Functions 120 receive common signals under test. Where a predetermined coupling of signals under test to Signal Analysis Functions 120 is known (and unvarying), then such coupling may be made directly without use of Optional Input Selection Module 110.

The Controller 170 controls the operation of Signal Analysis Functions 120, Time Base Controller 130, Trigger Controller 140 and Optional Input Selection Module 110, if present. Controller 170 comprises a Processor 176 and a Memory 178 for storing various control programs and other programs 178-P as well as data 178-D. Memory 178 may also store an operating system 170-OS such as the Windows® operating system manufactured by Microsoft Corporation of Redmond, Wash. Other operating systems, frameworks and environments suitable for performing the tasks described herein will also be appreciated by those skilled in the art and informed by the teachings of the present invention. For example, Apple®, Macintosh® operating systems, various UNIX-derived operating systems and the like also support functions such as those discussed herein.

Processor 176 cooperates with conventional Support Circuitry 174 such as power supplies, clock circuits, cache memory and the like, and circuits that assist in executing software routines stored in Memory 178. As such, it is contemplated that some of the steps discussed herein as software processes may be implemented within hardware, for example as circuitry that cooperates with Processor 176 to perform various steps. Controller 170 also contains I/O (input-output) Circuitry 172 that forms an interface between the various functional elements communicating with Controller 170. For example, I/O Circuitry 172 allows Controller 170 to communicate with each of the other elements 110–160 discussed herein with respect to FIG. 1.

Although Controller 170 is shown and described as a general purpose computer, programmed to perform various control functions in accordance with the present invention, the invention can be implemented in hardware as, for example, an application specific integrated circuit (ASIC) or field programmable gate array (FPGA). As such, the process steps described herein are intended to be broadly interpreted as being performed by software, hardware or a combination thereof.

Input Unit 150 comprises a keypad, a pointing device, a touch screen or other means adapted to provide user input to Controller 170. Controller 170, in response to such user input, adapts the operation of System 100 to perform various functions including data acquisition, triggering, processing, display, and communications. In addition, the user input may be used to trigger automatic calibration functions and/or adapt other operating parameters of Signal Analysis Functions 120, such as DSO (digital storage oscilloscope) functions, logic analysis functions, spectrum analysis functions and the like.

Controller 170 processes one or more acquired sample streams provided by Signal Analysis Functions 120 to generate respective waveform data associated with the one or more sample streams. For example, given desired time per division and volts per division display parameters associated with a DSO signal analysis function stream, Controller 170 operates to modify the raw data associated with the DSO sample stream to produce corresponding waveform data having the desired time per division and volts per division parameters. Controller 170 may also normalize waveform data having non-desired time per division and volts per division parameters to produce waveform data having the desired parameters. Controller 170 provides the waveform data to Presentation Device 160 for subsequent display. Presentation Device 160 may comprise a conventional display device such as a liquid crystal display (LCD), cathode ray tube (CRT) or other display device. Presentation Device 160 may include respective processing, input/output and memory functions such that video signals adapted to produce imagery upon the presentation device 160 may be provided by Controller 170 or, alternatively, generated by the presentation device 160 in response to non-video signals provided by Controller 170.

System 100 of FIG. 1 denotes a generalized representation of an actual system. For example, in one embodiment of the invention one signal analysis function comprises a DSO, another comprises a logic analyzer and a third comprises a spectrum analyzer. Thus, in this embodiment of the invention, only three of Signal Analysis Functions 120 are used and, correspondingly, an appropriate number of signals under test (SUT) are provided thereto.

Each of the sample streams acquired by System 100 of FIG. 1 is stored as a respective plurality of sample records, where a sample record may comprise a single sample point or a plurality of sample points. The sample records may be increased or decreased in size and may be scaled according to the memory requirements or availability of the system. Within the context of the subject invention, temporal alignment is used to align sample streams acquired from test and measurement instruments monitoring a plurality of measurement domains. Waveform imagery generated using the acquired sample streams may be aligned as image layers on a common XY plane where a Z axis perpendicular to the one or more image planes is used to provide imagery representing signals of an additional measurement domain or a mathematical processing of one or more of the measurement domains of interest. Coplanar waveform imagery will be discussed in more detail below with respect to FIGS. 3–5. It will be noted that the coplanar imagery discussed with respect to FIGS. 3–5 may also include more or fewer waveforms than shown, as well as more or fewer image planes than shown.

System 100 of FIG. 1 finds practical application in many test and measurement scenarios. For example, in one scenario an oscilloscope, a logic analyzer and a spectrum analyzer are used to measure or characterize the operation of a computer interface, such as a Bluetooth channel, a WiFi channel or an Ethernet channel. The techniques discussed herein are also applicable to other communications media and methodologies, such as satellite channels, hybrid fiber coax channels, wireless LAN channels and the like. The radio frequency (RF) domain is monitored by the spectrum analyzer to identify noise or other spectral anomalies that might be disruptive to data flow via the wireless computer interface. The analog domain is monitored by the oscilloscope to view the modulated logic signal that is being transmitted via the wireless computer interface. The digital domain is monitored by the logic analyzer to examine the digital packets that are reconstructed after reception via the wireless computer interface. One skilled in the art will quickly realize that the subject invention is extremely useful for clearly showing the relationship between measurements from all three measurement domains.

For example, it is useful to identify, or at least view, the relationship between a noise spike occurring in the RF domain and a packet error occurring in the digital or information domain. To facilitate such analysis, the subject invention renders these three complex domains in a manner that is readily accessible to a viewer. That is, the acquired sample streams representing measurements made in the three domains are temporally aligned and combined to provide waveform data in which analog and digital domain information are displayed within the XY coordinate system of an oscilloscope display, while spectral information is displayed on the Z-axis. Other use of the XYZ coordinate systems may also be employed. Of particular use is the ability to render a manipulable two-dimensional or three-dimensional display in which waveform data derived from each of the three domains is represented.

Thus, as discussed herein, one embodiment of the invention is the application of three-dimensional representations of multi-domain measurements of system operation in which one or more of an oscilloscope graph, a logic analyzer trace, a packet representation and a frequency spectrum waterfall image are combined into a single three-dimensional display with one axis being time, a second being measurement domain, and a third being intensity or content of the measured phenomena. The tools of three-dimensional graphics are applied to provide viewing position, perspective and artificial colorization or intensity gradation to highlight areas of interest.

Three-dimensional representation may be provided using holographic imagery, binocular vision and other techniques. Similarly, a third dimension may be represented using a two-dimensional display such as a perspective or isometric view. The two-dimensional representation may be fixed in perspective or manipulable by a user. By providing multiple domain waveform representations, inter-stream timing relationships, such as the timing relationship between a noise spike and a data corruption in the above example, may be established and displayed.

Figure 2:
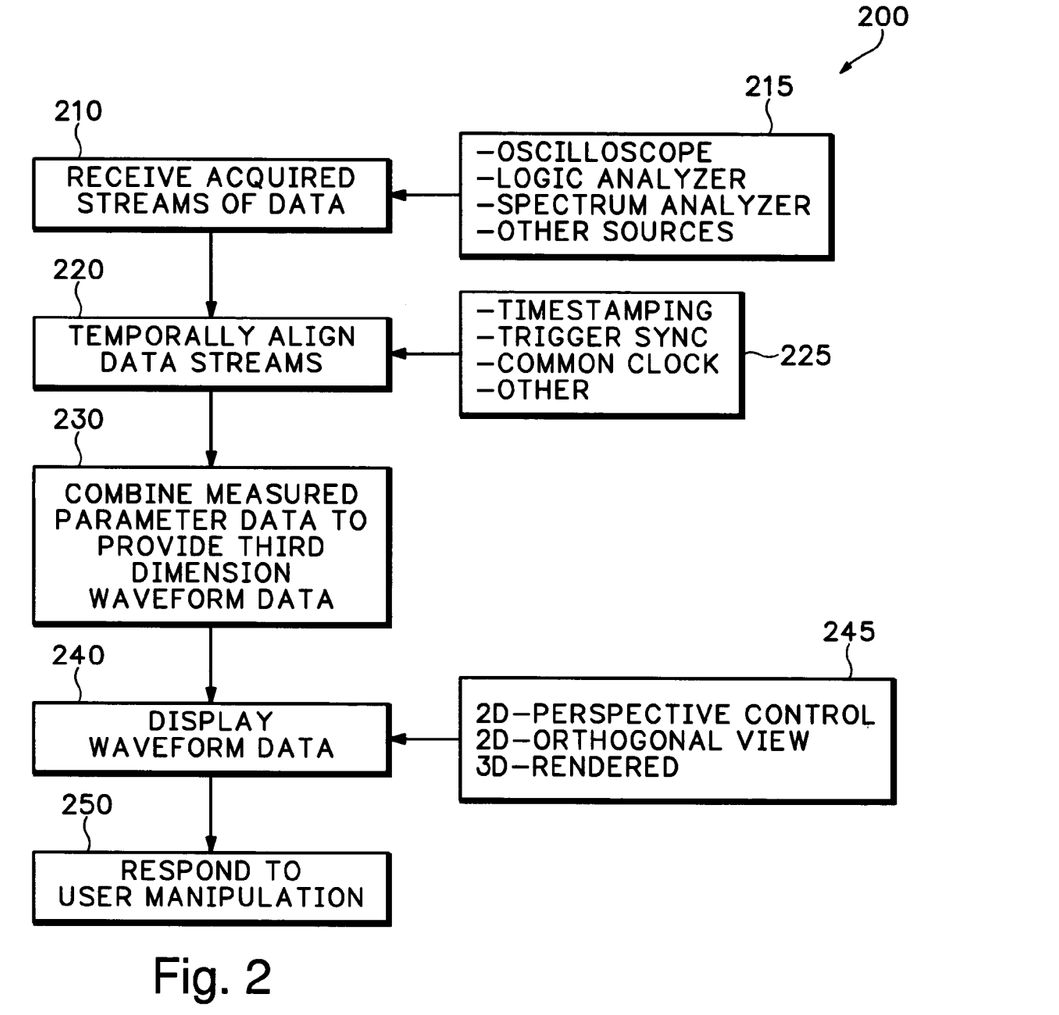
FIG. 2 is a flow diagram of a method according to an embodiment of the invention.

FIG. 2 shows a flowchart of a method according to an embodiment of the invention. Specifically, the method 200 of FIG. 2 is entered at step 210 when acquired streams of data are received. The acquired streams of data may be received from, per box 215, oscilloscopes, logic analyzers, spectrum analyzers and other test and measurement devices and/or sources.

At step 220, the acquired data streams are temporally aligned so that inter-stream timing relationships are established. That is, by temporally-aligning the acquired data streams, a viewer examining a subsequently rendered 2-D or 3-D representation of the waveforms may visually establish that an anomaly or event represented in one measurement domain is temporally-associated with a corresponding anomaly or event within another measurement domain. Per box 225, time stamping, trigger synchronization, a common clock, or other timing means provides the basis for temporal alignment of the measurements across the domains. In a time stamping embodiment, respective time stamps are inserted periodically, or provided contemporaneously with, each acquired data stream. The time stamps provide an indication of the acquisition time or other timing parameter (e.g., real time, trigger offset time, and the like). The time stamps are used to perform the temporal analysis function of step 220. In an alternate embodiment, a trigger synchronization scheme is used whereby each of the test and measurement devices (e.g., oscilloscope, logic analyzer, spectrum analyzer and the like) operate in response to a common trigger signal. The common trigger signal may be any triggering event and may be generated using digital or analog means. The triggering signal may be representative of a glitch, a runt signal (i.e., a signal having a less than acceptable amplitude), or other predetermined condition, transition, or anomaly, as well as an arrangement of data bits matching a desired sequential or combinatorial logic pattern. In an alternate embodiment, a common clock signal is used such that all of the test and measurement devices acquiring streams of data are synchronized. The time stamp, common trigger and common clock embodiments may be used individually or in any combination. It will be appreciated by those skilled in the art and informed by the teachings of the present invention that various buffering, delay and hold-off circuitry or control functions may also be employed to insure that system delays, acquisition delays and the like are compensated for as part of the temporal alignment process of step 220.

At step 230 the temporally-aligned data streams are combined and rasterized to provide waveform data suitable for display in three dimensions. The rasterization process used depends upon the type of display device employed to present the waveform data. For example, rasterization appropriate to a two-dimensional display such as a liquid crystal display or cathode ray tube may not be appropriate to the rasterization requirements of a holographic image, stereoscope image or other three-dimensional display technique.

At step 240 the waveform data is displayed according to, per box 245, a two-dimensional or three-dimensional display technique. Two-dimensional techniques include perspective control, orthogonal view (i.e., stacked display of waveforms) and other display techniques simulating a three-dimensional display. Three-dimensional display techniques comprise holographic images and other true three-dimensional renderings.

The display of the time-aligned waveforms according to the invention may be modified in many different ways. For example, rather than using a Z-axis representation, waveforms representative of a third measurement domain or a waveform associated with an inter-stream timing relationship may be represented by changes in intensity or color of the waveforms represented in the XY axis. For example, where energy associated with a particular spectral region is relatively high, a temporally-aligned signal acquired from the analog domain or digital domain contemporaneous with measurements made in the high energy RF domain may be displayed with a higher intensity level or different color level.

At step 250, the waveform data for display is adapted in response to user manipulation. For example, a two-dimensional orthogonal (i.e., "stacked") display simulating a three-dimensional display may be translated into a perspective view of the displayed waveform data, by user manipulation of an XYZ vector icon. Similarly, a waveform display having a three-dimensional perspective view may be adapted (i.e., translated or rotated) by a user, as desired.

Figure 3:
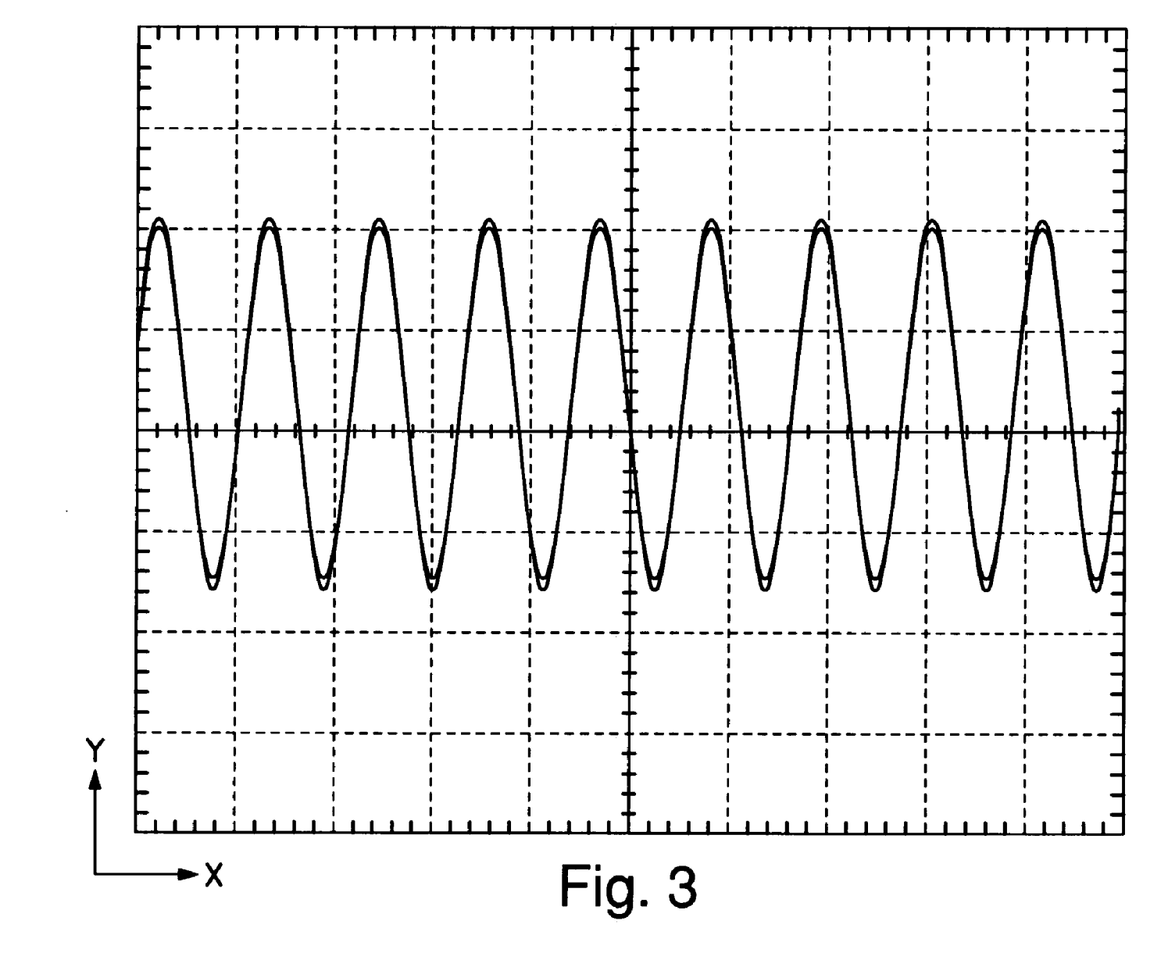
FIGS. 3, 4, and 5 are graphical representations useful in understanding the present invention.
Figure 4:
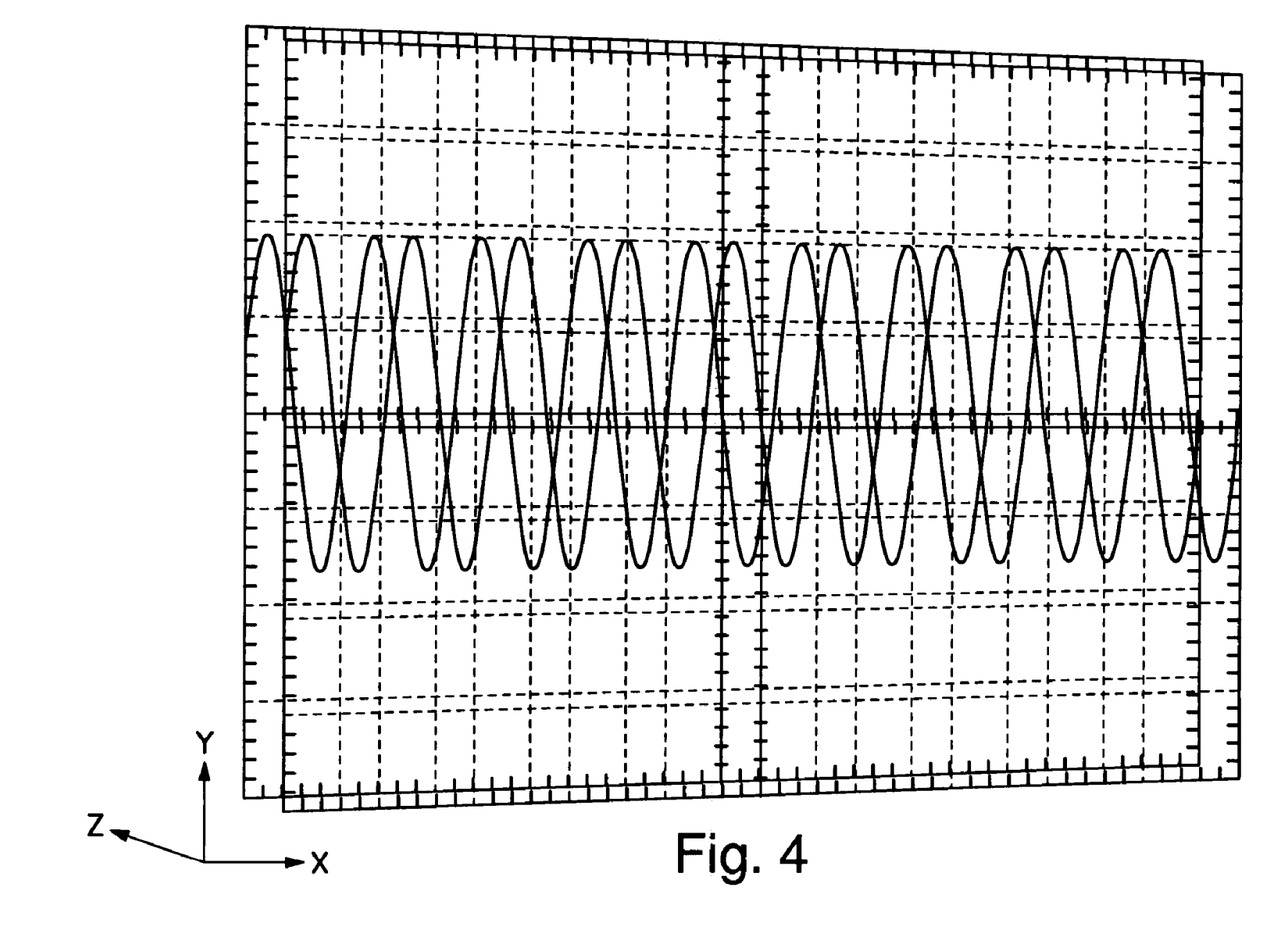
Figure 5:
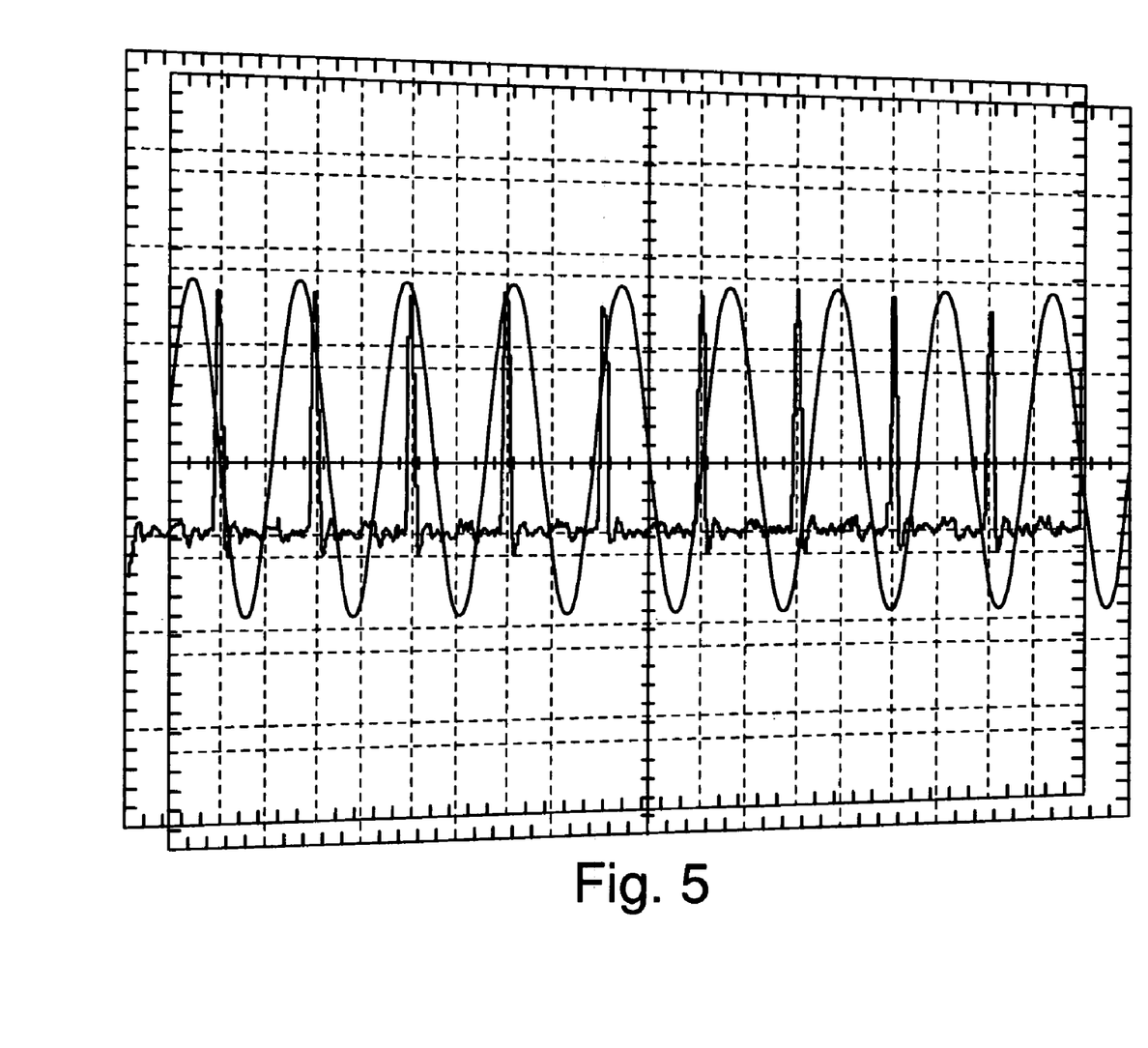

FIGS. 3, 4, and 5 are graphical representations of screen displays useful in understanding the present invention. FIG.

3 shows a screen display of two precisely time-aligned, overlapped (i.e., "stacked") sine waves. In such a display, it can be said that a Z-axis is present, but provides no viewing perspective to a user because the Z-axis of the display is perpendicular to the user's field of view. The two overlapping sine waves of FIG. 3 become distinct when the viewing perspective is "tilted" as shown in FIG. 4. Thus, the XY coordinate representation shown in FIG. 3 becomes an XYZ coordinate representation in FIG. 4, by translating one of the screen displays in the X and Y axes with respect to the other screen display. Similarly, the screen display of FIG. 3 can be transformed into a perspective view by use of well-known graphical image rotation methods. FIG. 5 is a composite representation of a repetitive pulse signal and a sine wave signal having a perspective view similar to that of FIG. 4 such that additional spatial separation is provided.

Figure 6:
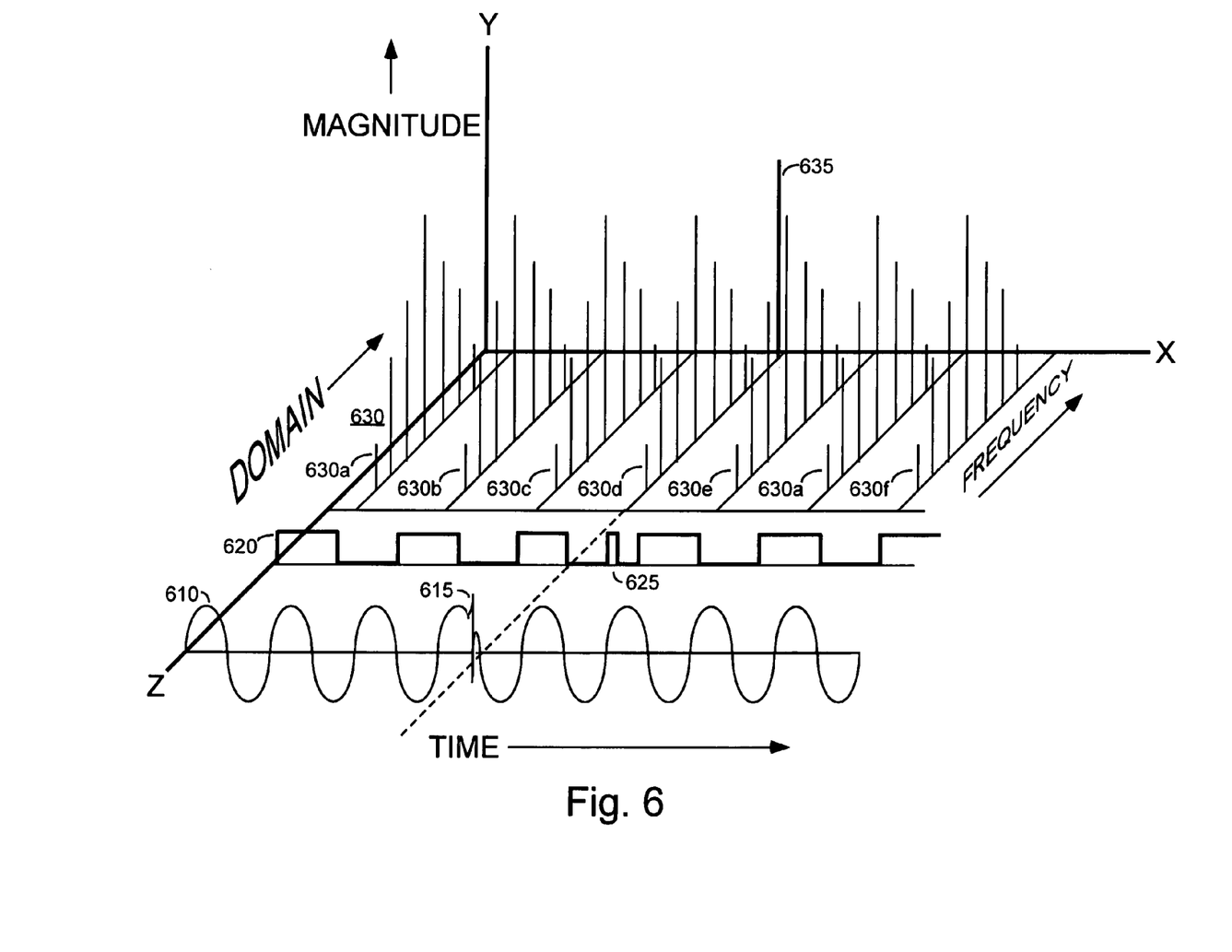
FIGS. 6 and 7 are illustrations of screen displays in accordance with the invention.

FIG. 6 shows a screen display in perspective view in accordance with the subject invention. In FIG. 6, the X-axis represents TIME, the Y-axis represents MAGNITUDE, and the Z-axis represents DOMAIN. Specifically, waveform 610 is a waveform captured from the Analog Domain, waveform 620 is a waveform captured from the Logic Domain, and the area generally-designated 630 contains spectra 630a, 630b, 630c, 630d, 630e, and 630f captured from the Frequency Domain. Only seven spectra were shown in FIG. 6 to avoid cluttering the drawing for purposes of clarity. In fact, a spectrum exists at each point in time that corresponds to a sample point. All available spectra may, or may not, be displayed simultaneously depending upon the particular data to be highlighted.

Note the substantially simultaneous appearance of a "glitch" 615 on analog waveform 610, a signal anomaly 625 on logic waveform 620, and a spurious trace (i.e., a "spur") 635 in the spectrum 630d. In such a case, it may be desirable to display only the single spectrum 630d that shows the spur.

Figure 7:
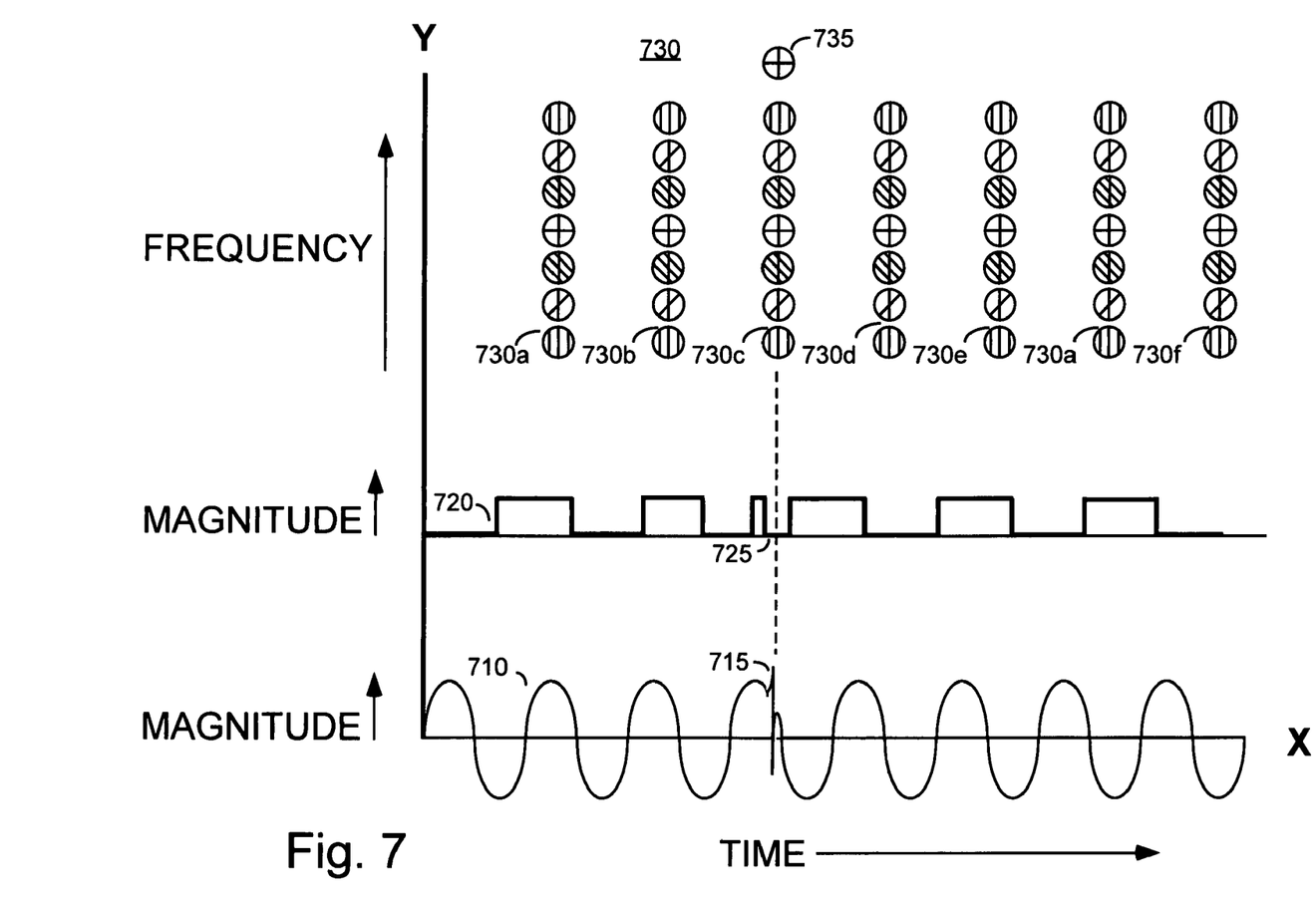

FIG. 7 is an orthogonal screen view showing the same information as the perspective view of FIG. 6. In FIG. 7, the X-axis represents TIME, the Y-axis represents MAGNITUDE for the Analog Domain waveform 710 and the Logic Domain waveform 720, but represents FREQUENCY for the spectra of the Frequency Domain. In FIG. 7, the Z-axis applies to the Frequency Domain only, and is arranged such that it is perpendicular to the screen display and pointed directly toward the viewer. Thus, the spectra 730a through 730f are rotated such that viewer is looking directly down the Z-axis onto the tops of the individual energy spikes. In this example, the relative magnitudes of each of the energy spikes is shown by color (denoted by different cross hatching). Note that the spur 735 is more readily observable in the example of FIG. 7 than it is in the example of FIG. 6. In the examples shown in both FIGS. 6 and 7 the spur is substantially the same magnitude as the center frequency component. Note also that the dotted line shows that spectrum 730c is time-aligned with glitch 715, and anomaly 725.

As discussed above with respect to FIG. 6, only seven spectra were shown in FIG. 7. If all of the spectra were shown in FIG. 7, the spectra would be packed together so closely that area 730 would appear as solid multi-colored sheet. It is herein recognized that such a display may be very useful, because the human eye is quite good at discerning different areas of differing color.

In one embodiment of the invention, the viewer or user may highlight contemporaneous or temporally aligned portions of each of the measurement domain waveforms to establish an area of interest, which area of interest may be magnified or "zoomed in" to allow more detailed examination of the waveforms. Moreover, other oscilloscope waveform processing functions such as mathematical functions may be employed to process the various waveforms and drive thereby additional information useful to the test and measurement instrument user. For example, in response to a primary or secondary trigger condition existing in one of the measurement domains, a mathematical function may be employed to process contemporaneously acquired or relevant samples from another measurement domain.

While the foregoing is directed to the preferred embodiment of the present invention, other and further embodiments of the invention may be devised without departing from the basic scope thereof, and the scope of the invention is determined by the claims that follow.

What is claimed is:

1. A method, comprising, the steps of:
receiving a plurality of sample streams representing respective signal measurements made in differing measurement domains;
temporally-aligning said sample streams;
generating waveform data associated with said temporally aligned sample streams, said waveform data representing sample magnitudes as a function of time and including Z-axis information adapted to illustrate at least one inter-stream timing relationship; and
displaying said waveform data on a display screen.

2. The method according to claim 1 wherein said waveform data provides a three-dimensional representation of said time domain measurements.

3. The method according to claim 2 wherein said three-dimensional representation comprises one of an orthogonal view, a holographic propagation and a perspective view.

4. The method according to claim 2 wherein said three-dimensional representation is manipulable.

5. The method according to claim 2 wherein said three-dimensional representation is provided by rendering two-dimensional waveforms which are adapted in perspective in response to a control signal.

6. The method according to claim 1 wherein said inter-stream timing relationship is established by use of at least one of a common trigger event, a timestamp, and a common clock signal.

7. The method according to claim 1 wherein each of said sample streams is temporally-aligned to another of said plurality of said sample streams by use of timestamps.

8. The method according to claim 1 wherein each of said sample streams is temporally-aligned to another of said plurality of said sample streams by use of a common clock.

9. The method according to claim 1 wherein each of said sample streams is temporally-aligned to another of said plurality of said sample streams by use of a common trigger event.

10. The method according to claim 9 wherein said common trigger event is one of an analog signal condition, an analog signal transition, an analog signal anomaly, parallel logic combination, and a serial logic combination.

11. The method according to claim 1 wherein said sample streams represent at least a radio frequency (RF) spectrum, an analog signal, and a digital signal.

12. The method according to claim 11 wherein X and Y axes for plotting said analog and digital signals are time and magnitude respectively, and X and Y axes for plotting said RF spectrum are frequency and magnitude respectively, and a z-zaxis displacement is indicative of a difference in measurement domain.

13. The method according to claim 11 wherein:
said RF signal comprises spectral measurements associated with a communications medium;
said analog signal comprises a modulated signal passing through said communications medium; and said digital signal represents demodulated data received via said communications medium.

14. The method according to claim 13 wherein said waveform data is adapted to display an inter-stream timing relationship between an anomaly in said spectral measurement and an anomaly in said demodulated data.

15. The method according to claim 13 wherein said communications medium comprises at least one of a Bluetooth channel, a WiFi channel, an Ethernet channel, a satellite channel, a hybrid fiber coax channel, a wireless LAN channel.

16. The method according to claim 1 wherein each of said sample streams has associated with it a respective sequence of time stamps, said time stamps adapted for use in temporal alignment.

17. The method according to claim 1 wherein said plurality of sample streams represent an oscilloscope graph, a logic analysis trace, a packet representation and a frequency spectrum waterfall.

18. A method, comprising, the steps of:
receiving a plurality of sample streams representing respective signal measurements made in differing measurement domains;
temporally-aligning said sample streams;
generating waveform data associated with said temporally aligned sample streams, said waveform data representing sample magnitudes as a function of time and including Z-axis information adapted to illustrate at least one inter-stream timing relationship;
wherein said plurality of sample streams represent an oscilloscope graph, a logic analysis trace, a racket representation and a frequency spectrum waterfall; and
wherein said waveform data is produced in a display in which a first axis is time, a second axis is measurement domain and a third axis is content of a measured phenomenon.

19. The method according to claim 18 wherein said content is represented by at least one of a varying intensity level and a varying color.

20. The method according to claim 19 wherein said content represents a corruption of data within a communications channel.

21. The method according to claim 20 wherein in response to completion of data events, said display is adapted to provide visual association between packet errors and RF spectrum measurements.

* * * * *